United States Patent [19]

Sweitzer

[11] Patent Number: 5,615,477
[45] Date of Patent: Apr. 1, 1997

[54] METHOD FOR INTERCONNECTING A FLIP CHIP TO A PRINTED CIRCUIT SUBSTRATE

[75] Inventor: Brent N. Sweitzer, Nerstrand, Minn.

[73] Assignee: Sheldahl, Inc., Northfield, Minn.

[21] Appl. No.: 644,585

[22] Filed: May 10, 1996

Related U.S. Application Data

[63] Continuation of Ser. No. 301,873, Sep. 6, 1994, abandoned.

[51] Int. Cl.$^6$ .................................................. H05K 3/34
[52] U.S. Cl. ...................... 29/840; 228/180.22; 361/743; 361/764
[58] Field of Search ...................... 29/840, 841; 101/129; 174/260; 228/180.22, 254; 361/764, 743; 257/778, 779

[56] References Cited

U.S. PATENT DOCUMENTS

| | | | |
|---|---|---|---|
| 3,868,724 | 2/1975 | Perrino | 357/65 |
| 3,965,568 | 6/1976 | Gooch | 29/583 |
| 4,219,882 | 8/1980 | Cooper et al. | 365/2 |
| 4,221,047 | 9/1980 | Narken et al. | 29/840 |
| 4,425,401 | 1/1984 | Ido et al. | 428/329 |
| 4,628,406 | 12/1986 | Smith et al. | 361/386 |
| 4,647,959 | 3/1987 | Smith | 357/74 |

(List continued on next page.)

FOREIGN PATENT DOCUMENTS

| | | | |
|---|---|---|---|
| 0226433 | 6/1987 | European Pat. Off. | |
| 435584 | 7/1991 | European Pat. Off. | 29/840 |
| 0482940 | 4/1992 | European Pat. Off. | |
| 6120655 | 4/1994 | Japan | 29/840 |
| 9418707 | 8/1994 | WIPO | |

OTHER PUBLICATIONS

Toute l'Electronique, No. 446, Aug. 1979 Paris FR, pp. 25–30 M. Monnier 'Circuiterie sur film polyimide'.
Recent Developments in Flip Chip Technology, by Art Burkhart, Dexter Electronic Materials Industry, California; Surface Mount Technology, Jul. 1991, pp. 41–44.
Flip Chips, CSC™ Cherry Semiconductor product literature.
Flip Chip Bonding Offers Packaging Alternative, by Michael Schneider, Research Devices, Piscataway, N.J.; Hybrid Circuit Technology, Mar. 1988.

*Primary Examiner*—Peter Vo
*Attorney, Agent, or Firm*—Merchant, Gould, Smith, Edell, Welter & Schmidt, P.A.

[57] ABSTRACT

A printed circuit assembly and a method of manufacturing therefor are provided for directly connecting unpackaged integrated circuit chips such as flip chips to a footprint of active contact pads on a printed circuit substrate. A reduction in packaging density is obtained by electrically interconnecting one or more of the active contact pads with circuit traces formed on different layers of the printed circuit substrate. In a preferred embodiment, at least one of the active contact pads includes an electrically conductive through hole electrically connecting the contact pad and a circuit trace located on the back side of a double-sided printed circuit substrate. In another embodiment, the printed circuit substrate is a multilayer construction, which enables active contact pads to be electrically interconnected with circuit traces on a plurality of circuit layers.

31 Claims, 2 Drawing Sheets

U.S. PATENT DOCUMENTS

| | | | |
|---|---|---|---|
| 4,700,473 | 10/1987 | Freyman et al. | 29/846 |
| 4,730,238 | 3/1988 | Cook | 361/414 |
| 4,748,495 | 5/1988 | Kucharek | 357/82 |
| 4,772,936 | 9/1988 | Reding et al. | 357/80 |
| 4,774,634 | 9/1988 | Tate et al. | 361/400 |
| 4,814,855 | 3/1989 | Hodgson et al. | 174/52.4 |
| 4,862,153 | 8/1989 | Nakatani et al. | 340/719 |
| 4,878,098 | 10/1989 | Saito et al. | 357/68 |
| 4,891,789 | 1/1990 | Quattrini et al. | 365/63 |
| 4,893,216 | 1/1990 | Hagner | 361/406 |
| 4,906,823 | 3/1990 | Kushima et al. | 228/245 |
| 4,924,352 | 5/1990 | Septfons | 361/388 |
| 4,942,452 | 7/1990 | Kitano et al. | 357/68 |
| 4,953,460 | 9/1990 | Wojcik | 101/129 |
| 4,967,950 | 11/1990 | Legg et al. | 228/180.2 |
| 4,980,034 | 12/1990 | Volfson et al. | 204/38.4 |
| 5,001,542 | 3/1991 | Tsukagoshi et al. | 357/68 |
| 5,008,997 | 4/1991 | Phy | 29/827 |
| 5,019,673 | 5/1991 | Juskey et al. | 174/52.2 |
| 5,019,944 | 5/1991 | Ishii et al. | 361/400 |
| 5,021,630 | 6/1991 | Benko et al. | 219/121.64 |
| 5,033,665 | 7/1991 | Todd | 228/103 |
| 5,045,975 | 9/1991 | Cray et al. | 361/412 |
| 5,073,118 | 12/1991 | Grabbe et al. | 439/71 |
| 5,109,601 | 5/1992 | McBride | 29/830 X |
| 5,111,279 | 5/1992 | Pasch et al. | 357/81 |
| 5,112,462 | 5/1992 | Swisher | 205/165 |
| 5,132,879 | 7/1992 | Chang et al. | 361/412 |
| 5,133,495 | 7/1992 | Angulas et al. | 228/180.1 |
| 5,137,791 | 8/1992 | Swisher | 428/612 |
| 5,168,346 | 12/1992 | Pasch et al. | 257/738 |
| 5,203,075 | 4/1993 | Angulas et al. | 29/830 |
| 5,227,589 | 7/1993 | Weeks | 174/263 |
| 5,242,100 | 9/1993 | Weeks | 228/180.1 |
| 5,261,593 | 11/1993 | Casson et al. | 228/180.22 |
| 5,275,330 | 1/1994 | Isaacs et al. | 228/180.22 |
| 5,289,631 | 3/1994 | Koopman et al. | 228/254 X |
| 5,316,787 | 5/1994 | Frankeny et al. | 427/97 |
| 5,364,707 | 11/1994 | Swisher | 428/612 |
| 5,435,732 | 7/1995 | Angulas et al. | 29/840 X |
| 5,450,290 | 9/1995 | Boyko et al. | 361/743 X |

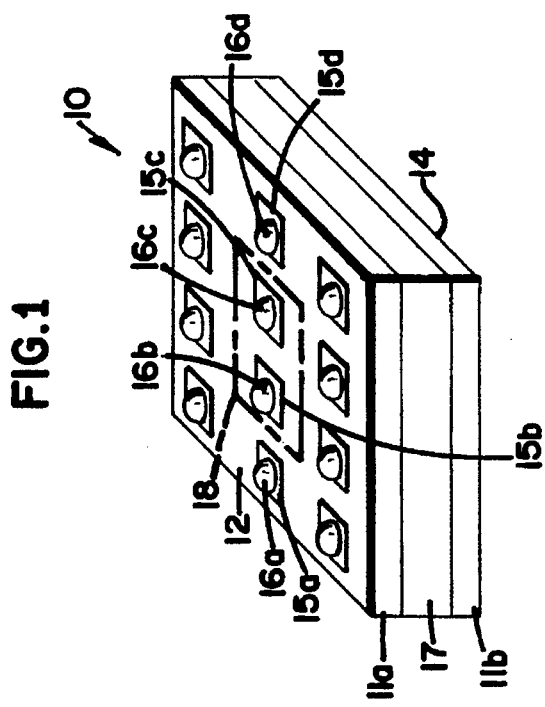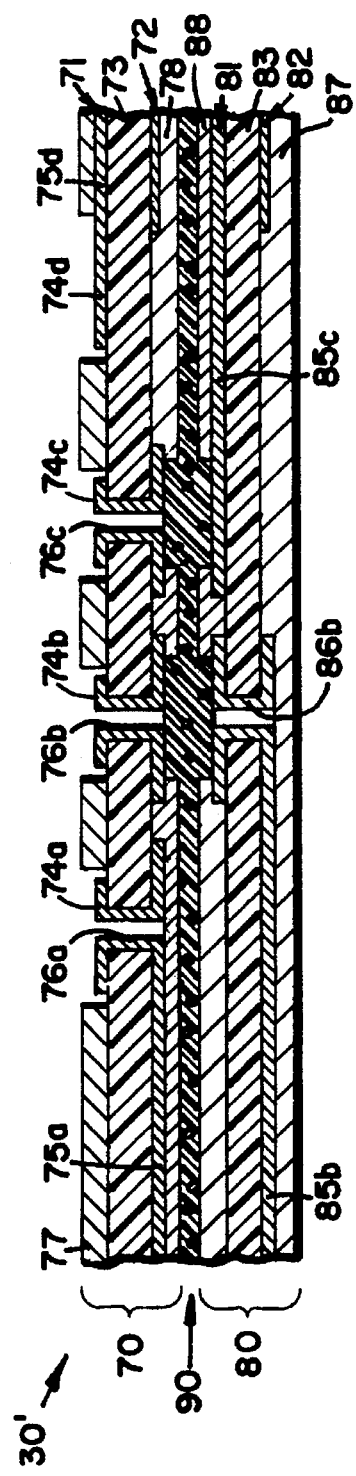

METHOD FOR INTERCONNECTING A FLIP CHIP TO A PRINTED CIRCUIT SUBSTRATE

This is a continuation of application Ser. No. 08/301,873, filed Sep. 6, 1994 now abandoned.

FIELD OF THE INVENTION

The invention is directed to a printed circuit assembly and a method for the manufacture thereof. In particular, the invention is directed to a printed circuit assembly and a method of manufacture having unpackaged integrated circuit chips electrically and mechanically connected to a flexible printed circuit substrate in a manner which provides increased packaging density and allows for greater flexibility in circuit design.

BACKGROUND OF THE INVENTION

As the speed, power and complexity of many of today's high performance electronic applications have increased, there has been a growing demand for increasing the packaging density on a printed wiring board, or printed circuit substrate, to accommodate a greater number of more complex components on the board. Packaging density is primarily improved by decreasing the size of and spacing between individual components on the board, such as integrated circuit chips, conductive traces, and other components which are typically found on many printed circuit assemblies.

One manner of increasing the packaging density on a printed wiring board is by utilizing a surface mount technology (SMT) such as OMPAC packaging, which is exemplified by U.S. Pat. No. 4,700,473, issued to Freyman et al. In this form of packaging, through holes are formed in the chip carrier to connect conductive traces routed on the chip carrier with solder bumps which have been formed on the back side of the carrier in a ball grid array. An unpackaged integrated circuit chip having leads disposed about its periphery is wire bonded to the conductive traces on the carrier. The OMPAC packaging as a whole is then bonded to a printed wiring board by reflowing the solder bumps to connect with corresponding contact pads on the printed wiring board.

While carrier-based processes such as OMPAC packaging have represented improvements in packaging density, the processes nonetheless suffer from a number of drawbacks, including increased real estate (packaging area), increased numbers of materials and processing steps, increased interconnect layers and connections, increased risk of failure due to potential mismatches between chip, carrier and substrate, as well as increased cost.

Other SMT processes eliminate the necessity for chip carriers and the attendant drawbacks associated therewith. One such interconnect technology utilizes direct application of flip chips to a printed wiring board. Flip chips are unpackaged integrated circuit chips that may be wirebonded to a printed wiring board, or alternatively may be soldered to a board through solder bumps disposed on the bonding pads of the chips. The active side of a flip chip contains the active devices and bonding pads, and has a passivation layer that can protect its active components from environmental contaminants. The back side of a flip chip, opposite to the active side, may contain markings indicating die part numbers and an electrical orientation for the circuit application. The flip chips are so named because they are mounted with their active side facing down towards the circuit substrate, with their solder bumps in registration with contact pads formed into a footprint on the printed circuit substrate.

A type of flip chip connection method is controlled collapsed chip connection (C-4) soldering, which involves registering the solder bumps of a flip chip on matching wettable solder contacts of the substrate, and then heating the solder to induce reflow and electrical connection between the chip and the substrate. By means of registration, I mean the placement of a flip chip on a substrate, such that each solder bump on the flip chip is located directly over its corresponding active contact pad, and such that the flip chip is in a position to be electrically connected without further movement of the flip chip or the substrate. The temperatures required to reflow the solder bumps using C-4 soldering, however, has made this process unsuitable for a number of lower cost substrates such as flexible substrates incorporating polyimide or polyester films, particularly those in which adhesives are used to bond copper circuit patterns to the substrate films.

Several other flip chip processes, however, use lower temperature solder compositions to reduce the amount of heat necessary to form interconnections between flip chips and the base substrate. For instance, U.S. Pat. No. 4,967,950 uses a thermode heat probe in contact with a flip chip to heat an eutectic alloy which has been "tinned" onto the contact pads on a substrate.

Another lower temperature process for attaching flip chips to a substrate is disclosed in U.S. Pat. No. 5,261,593, issued to Casson et al. To the extent necessary to support this disclosure, the disclosure of this reference is incorporated by reference herein.

In the Casson et al. process, a low temperature solder paste is registered on contact pads on a printed wiring board. One or more chips are then registered on the printed wiring board over the contact pads such that the solder bumps on the chips are in registration with the solder paste on the contact pads. The solder paste on each contact pad on the entire assembly is then reflowed by heating the assembly as a whole, such as in an infrared reflow oven. The solder bumps and solder paste then form homogeneous compositions which solidify to provide mechanical and electrical interconnects between the flip chips and the board.

The Casson et al. process has an advantage over other direct application technologies in that a wider variety of substrates may be used in conjunction with the process since the substrates are typically exposed to lower temperatures. One suitable substrate is a flexible adhesiveness metallized laminate such as the laminates sold under the trademark NOVACLAD® by Sheldahl, Inc. of Northfield, Minn., which are the subject of U.S. Pat. Nos. 5,112,462 and 5,137,791 to Swisher. To the extent necessary to support this disclosure, the disclosures of these references are incorporated by reference herein.

Direct chip interconnection processes may provide increases in packaging density; however, as the number of input/output connections on a chip increases, the ability to provide further improvements in packaging density with these methods become limited. In particular, higher performance chips require greater numbers of input/output connections, which in turn require larger, more expensive, and less reliable chips since input/output connections are conventionally disposed about the chips' periphery.

The number of input/output connections on a chip may be increased without increasing the overall size of the chip by providing bonding pads in a grid array over the active surface of a chip (i.e., around the periphery and in an interior area bounded by the bonding pads around the periphery). However, one drawback with this particular process is the difficulty in routing conductive traces on a single conductive layer on a substrate to the contact pads on the layer which bond with the bonding pads formed in the interior area of the chip.

For example, FIG. 2 shows a conventional single-sided grid array design. In the single-sided design, some of the conductive traces, such as conductive trace 112b which is connected to active contact pad 110b, are required to be routed between other contact pads, such as pads 110e and 110f. While routing conductive traces between contact pads is not particularly problematic for smaller grid arrays, it will be appreciated that for large arrays of contact pads (e.g., a 26×26 array of pads) a significant number of lines (e.g., at least 12 lines for a 26×26 array) would need to be routed between individual contact pads. However, the spacing required between contact pads to accommodate a large number of traces may significantly reduce the number of input/output connections which may be provided on a given size of chip. Alternatively, the required spacing between contact pads for a given number of conductive traces may require an increase in the size of the chip, which is often not economically or technologically feasible, and which is counter to the miniaturization trend in the electronics industry.

Consequently, it will be appreciated that the density of input/output connections on a flip chip (and therefore the number of connections which may be provided on a single chip) is typically limited by the minimum line spacing, line width, and number of lines which must be routed between opposing contact pads on a printed wiring board in each of the above-described processes, particularly for bonding flip chips having grid arrays of solder bumps disposed thereon.

Therefore, a need exists in the art for providing interconnections between an unpackaged integrated circuit chip and a printed wiring board which offers improved packaging density. In particular, a need exists for connecting grid array chips (i.e., chips with solder bumps arranged in a grid array, rather than being disposed about the periphery) in a manner which reduces limitations imposed by routing multiple lines between contact pads on a printed wiring board such that greater packaging density of input/output connections on unpackaged integrated circuit chips may be provided.

SUMMARY OF THE INVENTION

The invention addresses these and other problems associated with the prior art in providing a printed circuit assembly and method of manufacture therefor having increased packaging density achieved by routing active contact pads on a printed circuit substrate to conductive traces located on different layers on the substrate. Through the use of the invention, the number of circuit traces between contact pads on a layer of a printed circuit board may be significantly reduced, which offers increased flexibility for circuit design, as well as greater packaging density.

In accordance with one aspect of the invention, a printed circuit assembly is provided which includes an unpackaged integrated circuit chip having a plurality of bonding pads formed on an active side thereof; a printed circuit substrate having first and second patterns of conductive material defined on first and second sides of the printed circuit substrate, respectively, the first side including a plurality of active contact pads defined thereon in a footprint such that each active contact pad is arranged and configured to oppose a corresponding bonding pad on the unpackaged integrated circuit chip; and an interconnecting means for electrically and mechanically interconnecting the bonding pads on the unpackaged integrated circuit chip with the active contact pads on the printed circuit substrate. Further, at least one of the active contact pads includes an electrically conductive through hole such that at least one of the bonding pads on the unpackaged integrated circuit chip is electrically and mechanically interconnected to the active contact pad with the electrically conductive through hole on the printed circuit substrate.

In accordance with a further aspect of the invention, a printed circuit assembly is provided including a flip chip having a plurality of bonding pads formed on an active side thereof, at least a portion of which are disposed within an interior portion of the active side of the flip chip; and an adhesiveless metallized laminate having first and second circuit patterns of conductive material defined on first and second sides of the adhesiveless metallized laminate, respectively. The first side of the adhesiveless metallized laminate includes a plurality of active contact pads defined thereon in a footprint such that each active contact pad is arranged and configured to oppose a corresponding bonding pad on the flip chip. At least one active contact pad is a through hole bearing active contact pad including a metallized through hole electrically interconnecting the through hole bearing active contact pad with a circuit trace defined on the second circuit pattern. Further, each active contact pad is mechanically and electrically interconnected with a corresponding bonding pad on the flip chip through an electrically conductive interconnection which includes a homogeneous solder composition being formed by reflowing solder paste located on each active contact pad such that the solder paste mixes with the solder bump located on the corresponding bonding pad on the flip chip. A bonding pad on the flip chip is therefore electrically and mechanically interconnected to a trace on the second circuit pattern through the through hole bearing active contact pad on the adhesiveless metallized laminate.

According to a further aspect of the invention, a printed circuit assembly is provided which includes an unpackaged integrated circuit chip having a plurality of bonding pads formed on an active side thereof; a printed circuit substrate having traces defined on first and second circuit patterns which are disposed on first and second sides of the printed circuit substrate, respectively, the printed circuit substrate including a chip receiving area having a size and a shape which substantially conforms to the size and shape of the active side of the unpackaged integrated circuit chip; and means, disposed wholly within the chip receiving area of the printed circuit substrate, for electrically interconnecting at least one of a plurality of active contact pads disposed on the first circuit pattern of the printed circuit substrate within the chip receiving area to a trace located on the second circuit pattern of the printed circuit substrate. A portion of the bonding pads on the unpackaged integrated circuit chip are defined about the periphery of the active side of the chip, and another portion of the bonding pads are defined within an interior portion of the active side of the chip. Each active contact pad on the printed circuit substrate is mechanically and electrically interconnected in an opposing relationship with a corresponding bonding pad on the unpackaged integrated circuit chip.

According to an additional aspect of the invention, a printed circuit assembly is provided including an unpackaged integrated circuit chip having a plurality of bonding pads formed on an active side thereof; a multilayer printed circuit substrate including first, second and third circuit patterns defined thereon with the second circuit pattern interposed between the first and third circuit patterns, and the first circuit pattern including a plurality of active contact pads defined thereon in a footprint such that each active contact pad is arranged and configured to oppose a corresponding bonding pad on the unpackaged integrated circuit chip; and interconnecting means for electrically and mechanically interconnecting each active contact pad on the printed circuit substrate with the corresponding bonding pad on the unpackaged integrated circuit chip. The plurality of active contact pads includes first and second through hole bearing active contact pads, each including an electrically conductive through hole electrically interconnected thereto. The first contact pad is electrically connected to a circuit trace on the second circuit pattern, while the second contact pad is electrically interconnected to a circuit trace on the third circuit pattern.

In accordance with a further aspect of the invention, a method for mechanically and electrically interconnecting a flip chip to a printed circuit substrate is provided, the flip chip being of the type including a plurality of bonding pads defined on an active side thereof, at least a portion of the bonding pads having solder bumps formed thereon. The method includes the steps of providing an adhesiveless metallized laminate having first and second circuit patterns defined on the first and second sides of the adhesiveless metallized laminate, respectively, and the first side of the adhesiveless metallized laminate including a plurality of active contact pads defined thereon in a footprint such that each active contact pad is arranged and configured to oppose a corresponding solder bump on a flip chip; providing solder paste on each active contact pad on the adhesiveless metallized laminate; placing the flip chip on the adhesiveless metallized laminate such that the solder paste on each active contact pad is in registration with the corresponding solder bump on the flip chip to form an unsoldered chip-substrate assembly; and heating the chip substrate assembly such that the solder paste on each active contact pad reflows to form an electrical connection with the corresponding solder bump on the flip chip. At least one active contact pad on the adhesiveless metallized laminate includes an electrically conductive through hole disposed thereon for electrically interconnecting the first and second circuit patterns.

These and other advantages and features, which characterize the invention are pointed out with particularity in the claims annexed hereto and forming a part hereof. However, for a better understanding of the invention and the advantages and objectives obtained by its use, reference should be made to the drawing which forms a further part hereof and to the accompanying descriptive matter, in which there is described a preferred embodiment of the invention.

BRIEF DESCRIPTION OF THE DRAWING

FIG. 1 is a perspective view of an active side of a flip chip having an array of solder bumps disposed thereon.

FIG. 4 is a cross-sectional view of a multilayer printed circuit substrate consistent with the principles of the invention.

DETAILED DESCRIPTION OF THE PREFERRED EMBODIMENT

Figure 3A:
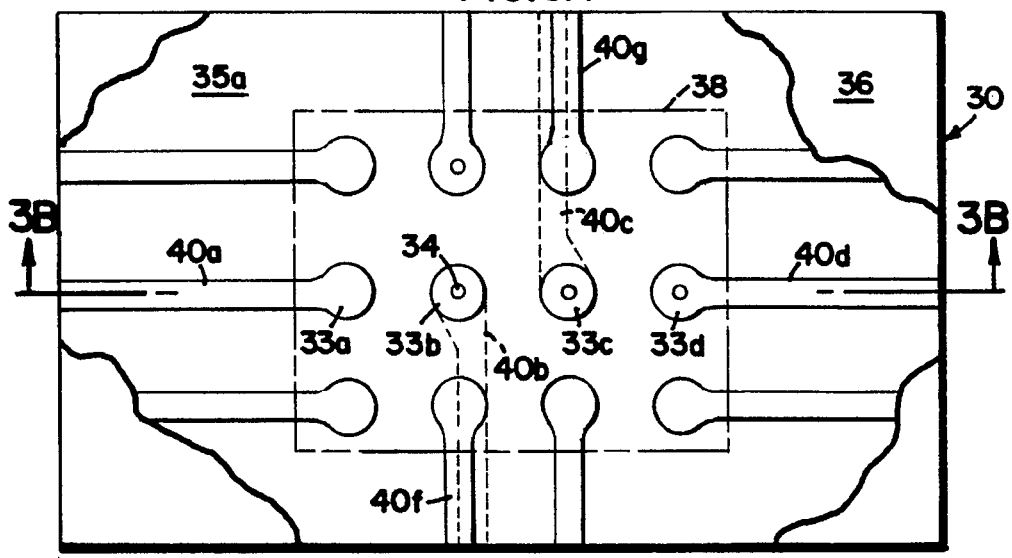
FIG. 3A is a top plan view of a double-sided printed circuit substrate consistent with the principles of the invention, wherein the solder mask disposed thereon is cut away for ease of illustration.
Figure 3B:
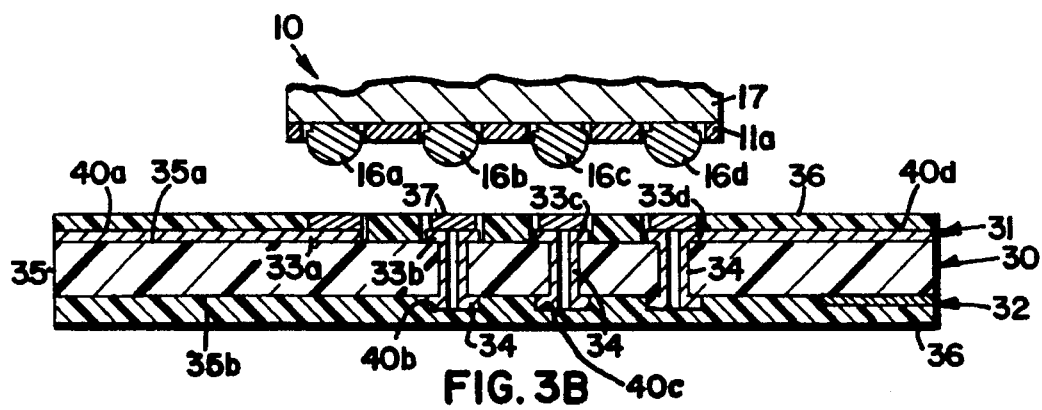
FIG. 3B is a cross-sectional view of the double-sided printed circuit substrate of FIG. 3A taken generally along line 3b–3b, with a flip chip shown opposite thereto, and with solder paste registered on the active contact pads thereof.

Turning to the Drawing, wherein like numbers denote like parts throughout the several views, FIGS. 3A and 3B show a preferred printed circuit substrate 30 consistent with the principles of the invention. Substrate 30 includes a number of active contact pads, such as pads 33a–d which are arranged into a footprint in a chip receiving area 38 for providing the electrical connections with the input/output connections of a flip chip or other unpackaged integrated circuit chip. Consistent with the invention, packaging density is greatly improved by routing at least a portion of these active contact pads to different conductive layers within substrate 30. In particular, a preferred manner of routing contact pads to other layers is through the use of metallized through holes, such as through holes 34 which are formed on active contact pads 33b, 33c and 33d. By routing the contact pads to differing layers, a greater number of contact pads and traces interconnected thereto may be formed within the same surface area of substrate 30, providing for greater packaging density and added flexibility in circuit design.

A typical unpackaged integrated circuit chip for use in the printed circuit assemblies of the invention is shown as flip chip 10 in FIG. 1. Flip chip 10 is generally formed of a silicon chip 17 having passivation layers 11a and 11b formed over the active side 12 and back side 14 thereof, respectively. Bonding pads (e.g., pads 15a–d) are arranged in a grid array on active side 12 for providing input/output connections for flip chip 10. Some bonding pads, e.g., pads 15a and 15d, are disposed around the periphery, while others, e.g., pads 15b and 15c, are disposed in an interior area 18 which is bounded by the bonding pads along the periphery. It will be appreciated that by forming the bonding pads into a grid array, a greater number of input/output connections may be provided on active side 12 than if the bonding pads were restricted to being formed around the periphery.

While flip chip 10 shows only twelve bonding pads on active side 12, in practice, any number of bonding pads may be provided on a flip chip, typically requiring a comparatively smaller surface area than chips utilizing peripherally-disposed pads. For example, to bond a flip chip with 676 bonding pads to a substrate, many conventional technologies dictate that 169 bonding pads (676÷4) be arranged along each edge of the active side of the chip. In contrast, the same number of bonding pads may be arranged in a 26×26 grid array with 26 pads on a side.

While the preferred orientation of bonding pads on a flip chip for the purpose of maximizing the benefits obtained by the invention is a grid array of bonding pads, it will be appreciated that the principles of the invention may be applied to various flip chips irrespective of the number and arrangement of bonding pads on the flip chip. For instance, flip chips having bonding pads disposed only about the periphery of the chip may be used consistent with the invention.

Flip chip 10 also includes a number of solder bumps (e.g., solder bumps 16a–d) which are formed on the bonding pads during the manufacture of flip chip 10. It will be appreciated that some of the bonding pads may not be used in a particular application and therefore may not have solder bumps disposed thereon for interconnecting them with a printed circuit substrate in a particular assembly.

Solder bumps are typically deposited on the bonding pads of a flip chip during manufacture of the chip, typically in the manner described in Casson et al. Typical solder bumps are formed of tin lead compositions having between 3 and 10%-weight lead. One preferred solder composition is 6:94 tin:lead which has a melting point of 316° C., and which has been found to provide suitable adhesion and solder ductility properties. Solder bumps are roughly hemispherical in shape, typically having a diameter of 9 mils (225 microns, where 1 mil=25.4 microns) and a height of between 100 and 115 microns. It will be appreciated that the composition and size of the solder bumps may vary depending upon the particular application.

While the invention is preferably used to bond flip chips to a printed circuit substrate, it will be appreciated that other types of unpackaged integrated circuit chips having bonding pads on an active side thereof may be used consistent with the invention. For instance, rather than having solder bumps disposed on the bonding pads of a chip, other types of unpackaged integrated circuit chips may use metal leads or other structures to provide the electrical and mechanical connections with the substrate. Further, the principles of the invention are particularly suitable to unpackaged integrated circuit chips having bonding pads disposed within an interior portion of the active surface thereof.

A preferred double-sided printed circuit substrate 30 is shown in FIGS. 3A and 3B (not drawn to scale). Substrate 30 includes a dielectric substrate material 35 having first and second conductive layers 31 and 32 disposed on first and second sides thereof, respectively. Substrate material 35 is preferably a flexible polyimide dielectric substrate having a coefficient of thermal expansion substantially matched with that of copper to provide minimal shear force exposure to chips mounted on the substrate. It will be appreciated, however, that other flexible substrates such as other polyimide or polyester based substrates, as well as a number of non-flexible substrates such as ceramic or fiberglass substrates, may be used consistent with the invention.

First and second conductive layers 31 and 32 are preferably formed of copper, although conductive materials such as gold, silver, aluminum, etc. may be used. The conductive layers are preferably deposited on substrate material 35 by an adhesiveless metallization process such as is used for NOVACLAD® laminates, which is the subject of the aforementioned Swisher patents. The process includes the steps of (1) treating a film with a plasma made up of ionized oxygen produced from a metallic electrode to form a metal/oxide treated film and (2) forming metallized interconnection layers on the treated film, preferably either by vacuum metallization of metal, or by combination of vacuum metallization of metal and an additional step of electroplating metal on top of the vacuum-deposited metal. The first step in the process produces a bonding surface on the film which is capable of securing metal interconnection layers which, unlike adhesive-based substrates, have excellent delamination resistance, even when exposed to heat, chemical treatment, mechanical stress or environmental stress. Furthermore, for the second step, it will be appreciated that other combinations and types of deposition technologies such as sputtering and/or electroless plating may also be utilized.

First and second circuit patterns are formed on the first and second conductive layers 31 and 32, respectively, by a conventional etching process which removes unwanted material from the conductive layers, leaving only the desired conductive traces, contact pads, and other components deposited on substrate material 35. The formation of circuit patterns from a copper-clad laminate is generally known in the art.

A number of electrically conductive through holes, such as through holes 34, are also provided on substrate 30. These through holes electrically connect points of first and second conductive layers 31 and 32. As discussed below, a number of these electrically conductive through holes also form contact pads for receiving solder bumps on flip chips and forming electrical connections therewith.

Electrically conductive through holes are preferably constructed by a through hole metallization process which is an extension of the preferred adhesiveless metallization process. Metallized through holes are formed during production of a metallized laminate by first forming apertures in the substrate material 35 before metallization, such as by laser drilling, stamping, or other known methods. In addition, a cleaning step may be utilized to remove any burrs or other material in the apertures. Next, copper or another conductive material is deposited in the apertures concurrently with the formation of the copper on the first and second sides of substrate material 35 as described above. In addition to forming first and second copper layers on the substrate material, the metallization process forms conductive barrels circumscribing the walls of the apertures and electrically interconnecting the first and second copper layers.

It has been found that the preferred process offers several advantages in that the through holes formed are particularly robust, and may be deposited at the same thickness as each of the copper layers. The preferred process also provides a unique advantage in that metallized through holes may be formed with a relatively few number of processing steps, and with comparatively thinner copper to be utilized for the later imaging steps, which is particularly advantageous for imaging very fine traces (e.g., 25–75 micron line widths). Thinner copper layers (e.g., around 5 microns) have not been found to pose a problem since this thickness of copper adequately serves the current carrying requirements for most applications.

It will be appreciated, however, that a number of known alternative through hole manufacturing processes may be used. For instance, through holes may be drilled after metallization, with the copper deposited thereon by separate plating operations.

A typical substrate for use with the invention may include a 25–50 micron polyimide substrate, having through holes formed thereon, and having 5 microns of copper material deposited on first and second conductive layers 31 and 32 and in each of the through holes. It will be appreciated, however, that other dimensions may be used consistent with the invention. For instance, the copper may be plated to different thicknesses, such as 15–35 microns. Also, different thicknesses of substrate material may be used.

It will also be appreciated the printed circuit substrates for use for the invention may be constructed by various alternative processes. In particular, other adhesiveless processes are known in the art although most fail to achieve the same delamination resistance as the preferred process. Further, adhesive-based processes may be used consistent with the invention, although many are not as temperature resistant, and may not be capable of providing the same packaging densities as adhesiveless constructions. This is primarily due to thickness limitations in available copper foils to be laminated to adhesive-based dielectric substrates, often resulting in difficulties in patterning fine lines on the substrates.

As discussed above, a number of contact pads are provided in a grid array on printed circuit substrate 30 for receiving solder bumps on flip chip 10. The contact pads are preferably disposed within a chip receiving area 38 which conforms generally to the size and shape of the active side 12 of flip chip 10. It will be appreciated that only some of these contact pads may be "active" contact pads, as other pads on the chip may not be used in a particular application. This may occur, for example, when the flip chip used does not have a corresponding solder bump, or when a substrate is used for differing applications. In such instances, the non-active contact pads may or may not be electrically connected to a corresponding solder bump on a flip chip.

A number of the contact pads shown in FIG. 3A are conventional contact pads, such as pad 33a, which do not have through holes formed thereon, but rather are flat planar surfaces of conductive material. However, other active contact pads, such as pads 33b, 33c and 33d, include through holes integrally formed thereon to electrically connect the contact pad with another circuit layer on substrate 30, such as second conductive layer 32. In a preferred embodiment, the active contact pads are about 6 mils (150 microns) in diameter and are arranged in a grid array with the centers of the contact pads being 20 mils (0.5 mm) apart. It will be appreciated that the spacing and sizes of the contact pads will typically be dictated by the corresponding spacing and size of the solder bumps on a flip chip, which may vary from application to application.

The through holes in the active contact pads are preferably less than or equal to 75 microns in diameter, and more preferably about 25 or 50 microns, less the amount of copper plated therein (which is typically dictated by performance requirements, preferably about 5 microns). It will be appreciated that the size of these through holes may be larger or smaller than the preferred ranges depending upon the particular application.

It is believed that forming a plated through hole on a contact pad forms a particularly robust connection to a flip chip by effectively forming a "rivet" through the dielectric film. This improves the resistance of a contact pad to shear stress experienced during thermal cycling. To this extent, it may be beneficial to include through holes in active contact pads even when the contact pads are connected to conductive traces located on the same layer as the contact pads, e.g., in single-sided constructions.

Figure 2:
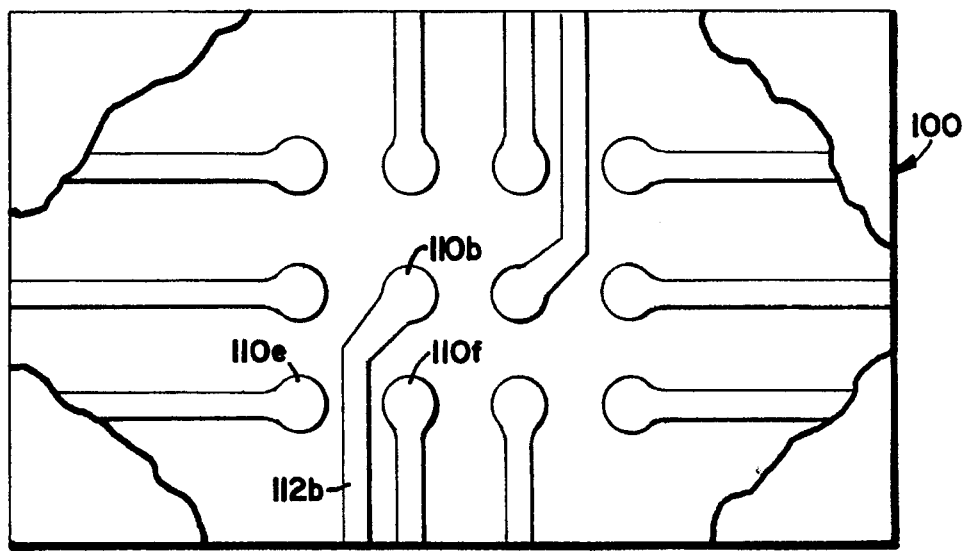
FIG. 2 is a top plan view of a conventional single-sided grid array printed circuit substrate having conductive traces routed on a conductive layer to active contact pads arranged in a grid array on the layer, wherein the solder mask disposed thereon is cut away for ease of illustration.

Each of the active contact pads on printed circuit substrate 30 is electrically interconnected to a conductive trace for transmitting the signals which are sent and received by each of the input/output connections on flip chip 10. Similar to many conventional processes, some of these conductive traces, such as traces 40a, 40d, 40f, and 40g, are routed on first conductive layer 31. However, by virtue of the through holes formed in some of the active contact pads, the pads may be electrically connected to conductive traces located on other circuit layers in printed substrate 30. In particular, active contact pad 33b is routed through a through hole to conductive trace 40b located in second conductive layer 32. Similarly, active contact pad 33c is electrically connected through a through hole to conductive trace 40c located in conductive layer 32. It will be appreciated that by routing these traces to other layers of the printed circuit substrate, greater flexibility and packaging density is obtained because there are less traces to be routed in each layer. For example, traces 40b and 40c may be routed to run substantially along the same path as traces 40f and 40g, respectively, rather than having to run between these traces in a conventional manner which is exemplified by the single-sided assembly shown in FIG. 2.

If the through holes are comparatively large, it is believed that an unacceptable amount of solder may "wick" to the opposing side of the through hole and consequently reduce the volume of solder for bonding the flip chip. However, it is believed that this is not a particular concern for assemblies constructed consistent with the most preferred dimensions and processing steps described herein.

One method to reduce the amount of wicking may be to electroplate sufficient copper to reduce the size or even completely close off the aperture. This approach may, however, limit the pitch of traces on the conductive layers since panel plating an amount of copper sufficient to close a 25 micron hole would significantly increase the thickness of the copper on the conductive surfaces. Pattern plating, on the other hand, would trade this problem for increased cost and processing steps. It is also believed that fully closing the through holes may also lead to processing difficulties due to possible entrapment of processing chemicals in the solid via structures.

Printed circuit substrate 30 also includes solder masks, or cover layers, 36 disposed over the top and bottom surfaces of the substrate. Masks 36 may be formed, for example, from a photodefinable dielectric material (e.g., polyimide, epoxy etc.), or alternatively, from a screen printed dielectric. Other known types of masks or cover layers may be used.

A number of apertures are preferably defined in mask 36 for exposing various components on printed circuit substrate 30. In particular, apertures are preferably formed around each of the active contact pads on printed circuit substrate 30 so that the contact pads are exposed for electrical connection with solder bumps on a flip chip.

The use of solder masks or cover layers also provides another method of suppressing wicking, whereby a solder mask or cover layer is applied to the back side of the substrate completely covering one or more of the through holes. It is believed that this method would reduce or eliminate wicking by preventing solder from flowing onto the circuit traces opposite the active contact pad, and thereby leaving more solder for forming a connection with a solder bump. However, this method is typically limited to double-sided applications since, unless the portions of the mask covering the apertures are removed, the solder mask would typically prevent interconnection of the through holes to subsequent layers of multilayer constructions.

The preferred manner of electrically and mechanically interconnecting flip chip 10 to printed circuit substrate 30 is generally disclosed in the aforementioned patent issued to Casson et al. However, it will be appreciated that other direct interconnection methods, such as the thermode method or the C-4 method might also be used. It will also be appreciated that the principles of the invention may be applied to carrier-based technologies such as TAB or OMPAC packaging.

Consistent with Casson et al., solder paste 37 is preferably registered onto the active contact pads on printed circuit substrate 30, e.g., on active contact pads 33a–d in FIG. 3B. The solder paste is typically a composition of solder in a carrier matrix of flux. The particular composition is chosen to have a viscosity value for easy registration of the paste through a stencil and onto the substrate, while having a solder content sufficient to form electrical connections with the flip chip. One preferred paste is a 90% metal material having a viscosity around 900 kcps. The flux used is a halide-free neutralized organic acid flux system, which allows for easy and thorough residue removal.

One preferred solder composition for the paste is a 63:37 eutectic alloy of tin:lead formed in spherical particles having diameters no larger than 45 microns, preferably no larger than 25 microns. Solder having this composition of materials has a reflow temperature in the range of 183° C. Another compatible solder paste is a 90% metal composition having 700 kcps viscosity, with the solder composition in the paste being a 63:35:2 eutectic alloy of tin:lead:silver formed in spherical particles having diameters no larger than 45 microns, preferably no larger than 25 microns. Solder having this composition of materials has a similar reflow temperature of about 182° C.

The above-described solder paste compositions provide an advantage in that they have relatively low reflow temperatures which reduces the environmental stresses on the flip chips and the substrate materials during reflow of the paste. However, given the environmental resistance of some adhesiveless metallized laminates such as NOVACLAD® laminates, it is contemplated that higher temperature solder compositions may also be used consistent with the invention.

Solder paste is preferably registered onto the active contact pads of printed circuit substrate 30 by a screen printing operation whereby the solder paste is stenciled onto the substrate through a stencil having etched openings for allowing the solder paste to pass through and register onto the active contact pads in controllable volumes. It has been found that this type of process is particularly suited for registering the solder paste of the invention since the volume of solder paste applied to each active contact pad is critical to the success of the method.

The critical volume of solder paste on an active contact pad is dependent primarily on the area of the active contact pad, the connected distance between the substrate and the corresponding flip chip in final assembled form, and the volume of the corresponding solder bump. The volume may be found by subtracting the volume of the solder bump from the volume of the desired electrical connection to obtain the desired volume of solder, and then calculating the volume of solder paste which would contain this volume of solder.

It is believed that the volume of solder paste applied to a contact pad may be the same regardless of whether the active contact pad bears a through hole defined thereon. However, it may be preferable in certain applications to accommodate for any potential wicking action (and subsequent reduction in available solder paste for bonding with the solder bump) and provide a greater volume of solder paste on through hole bearing active contact pads than on those contact pads not having through holes disposed thereon. This would preferably be performed by modifying the design of the stencil such that a greater volume of solder paste is registered onto the through hole bearing active contact pads.

Once solder paste is deposited on the active contact pads, one or more chips are preferably registered onto the printed circuit substrate. This is preferably an automated process using conventional optical placement equipment to place chips one-by-one onto the substrate. Each of the chips is placed onto the substrate such that the solder bumps thereon are in registration with the corresponding active contact pads on the substrate. While FIGS. 3A and 3B shown an embodiment of a printed circuit substrate having a single footprint for receiving a flip chip, it will be appreciated that a plurality of flip chips may be applied to a number of footprints formed on both sides of printed circuit substrate 30.

Once the chips have been placed onto the substrate, the assembly is next heated to a temperature sufficient to reflow the solder. Preferably, this step is performed by heating the assembly as a whole, for example, in a infrared reflow oven, a convection reflow oven, or a vapor phase reflow oven. It is also preferable to include a nitrogen purge in the oven prior to heating the assembly to prevent the formation of solder oxides. Other methods, such as using a thermode to apply heat and pressure to each chip individually may also be used, as may other bonding materials such as conductive epoxies. However, it has been found that by heating the assembly as a whole, stronger connections are formed between the solder bumps and the active contact pads since the chips are allowed to self-center during reflow. Further, less thermal stress is applied to the chips since the heat is not conducted through the active components of the chip. Also, heating the assembly as a whole is much faster than a thermode heating method since all of the chips are reflowed substantially simultaneously.

The heating step preferably reflows the solder in the solder paste at a temperature which is below that of the reflow temperature for the solder bumps on the flip chip. However, since the solder paste is readily miscible with the solder bumps, the reflowed solder paste and the solder bumps interact to form a homogeneous solder composition in the interconnect. The homogeneous solder composition then solidifies to form secure interconnections between the flip chip and the printed circuit substrate.

Various additional steps may also be provided to increase the reliability and durability of the finished assemblies. For example, the entire assembly may be cleaned after fellow using one of many commonly known cleaning techniques for printed circuit assemblies such as the use of freon-based or other solvents, as well as the application of ultrasonic energy to the assembly. Another step which may increase the durability of the assemblies is to coat the finished assembly with a low stress epoxy encapsulant. It has been found that this additional step increases the thermal cycling performance of the finished assemblies.

With respect to the through hole bearing active contact pads consistent with the invention, it is believed that the electrical interconnections formed between solder bumps and through hole bearing active contact pads will be stronger than the interconnections provided by the Casson et al. process. It is believed that this may be attributed to the operation of the through holes as "rivets" which anchor the connections against the back side of the substrate. Furthermore, it is believed that by wicking into the through hole and coating the conductive barrel formed therein, the solder composition will form a mechanical connection with a greater surface area of conductive material on the substrate, thereby supplementing the anchoring action provided by the copper barrel of the through hole. In addition, when a solder mask is disposed over the back side of an electrically conductive through hole, it is believed that the solder composition will become trapped within the through hole during reflow such that it solidifies proximate the solder mask, which may further increase the strength of the connections.

FIG. 4 shows a further embodiment of the invention, wherein active contact pads are electrically interconnected with two or more other circuit layers in a multilayer printed circuit substrate 30'. By expanding the number of circuit layers in the printed circuit substrate, an even greater packaging density may be obtained over conventional single-sided structures. By routing an active contact pad through an electrically conductive through hole, the active contact pad may be connected to traces located on any circuit layer within a multilayer construction, and may even utilize buried or blind vias, or other known connection design strategies. It is believed that a multilayer construction provides additional flexibility and increased packaging density over single or double-sided substrate assemblies due to the increased number of contact pads and interconnections which may be routed in a given surface area on the printed circuit substrate.

Various printed circuit fabrication technologies may be used to manufacture multilayer printed circuits consistent with the invention. For example, one preferred multilayer construction is the subject of U.S. patent application Ser. No. 08/142,243, filed on Oct. 22, 1993 by Anderson et al. To the extent necessary to support this disclosure, the disclosure of this reference is also incorporated by reference herein. It will be appreciated that other multilayer construction techniques, such as additive, semi-additive, plated through hole, etc., may be used consistent with the principles of the invention.

Multilayer circuit assemblies constructed consistent with the Anderson et al. process include at least two adhesiveless metallized laminates bonded in an opposing relationship through a conductive adhesive layer such that opposing circuit patterns on the two adhesiveless metallized laminates are mechanically and electrically interconnected by the conductive adhesive. The conductive adhesive used is preferably an anisotropic adhesive material having deformable heat fusible conductive particles disposed in a thermosetting polymer matrix. Further, cover layers preferably constructed of a screen printable polyimide ink are selectively layered over the adhesiveless metallized laminates to expose only those portions which are to be electrically interconnected by the conductive adhesive. Cover layers also are applied as solder masks for the exposed surfaces of the laminates.

For example, as seen in FIG. 4 (not drawn to scale), a four layer construction is shown which includes a pair of adhesiveless metallized laminates 70 and 80 joined through a conductive adhesive layer 90. It will be appreciated that the conductive adhesive layer shown in FIG. 4 includes representations of solder particles and electrical interconnections in the layer, and is therefore not intended to be an accurate depiction of the particular size, arrangement and number of the solder compositions in an actual construction.

Adhesiveless metallized laminate 70 includes first and second copper layers 71 and 72 formed on a polyimide dielectric substrate 73. Further, dielectric cover layers 77 and 78 are formed over the first and second copper layers 71 and 72, respectively, and having apertures defined in the cover layers to selectively expose portions of the conductive copper layers for electrical connection with other components. Similarly, adhesiveless metallized laminate 80 includes first and second copper layers 81 and 82 bonded to opposing surfaces of a flexible polyimide dielectric substrate 83, with dielectric cover layers 87 and 88 formed thereon. Therefore, copper layers 71, 72, 81 and 82 form the first, second, third and fourth copper layers on the four layer construction 30'.

To illustrate the principles of this embodiment of the invention, a plurality of active contact pads 74a, 74b, 74c and 74d are shown in FIG. 4 for interconnecting with solder bumps 16a, 16b, 16c and 16d of flip chip 10. Each of these contact pads is routed to a separate circuit layer on substrate 30'.

Active contact pad 74a bears a through hole 76a which connects active contact pad 74a to a conductive trace 75a disposed on the second copper layer 72 of adhesiveless metallized laminate 70. Active contact pad 74b likewise bears a metallized through hole 76b which opposes another metallized through hole 86b which is electrically connected thereto across conductive adhesive layer 90. Through hole 86b is, in turn, connected to a conductive trace 85b on the second copper layer 82 of adhesiveless metallized laminate 80. Active contact pad 74c bears a metallized through hole 76c which is electrically connected to a contact pad on copper layer 81 of adhesiveless metallized laminate 80 through conductive adhesive layer 90. This contact pad is, in turn, connected to conductive trace 85c on copper layer 81. Finally, active contact pad 74d is electrically connected to a conductive trace 75d on first copper layer 71 of adhesiveless metallized laminate 70.

In order to ensure adequate connections between contact pads opposed across a conductive adhesive layer, the size of such pads may be required to be larger than the active contact pads which are used to bond a flip chip to the printed circuit substrate. However, it is believed that contact pads may have a diameter as low as 125 microns or less, which would not significantly limit the potential packaging density provided by the invention.

It will be appreciated that any number of conductive layers may be incorporated into a multilayer construction, and therefore, the principles of the invention are not limited to the particular embodiments disclosed herein. In particular, an increase in the number of layers in a multilayer construction will increase the potential packaging density which may be obtained using the construction. Further, the addition of layers will give a circuit designer more flexibility in routing traces to and from the active contact pads.

It will be appreciated that various modifications may be made to the preferred embodiments consistent with the invention. For instance, other through-layer interconnections may be used alternatively to through holes, such as metal posts or solid rivets, which could provide additional heat conduction. Also, rather than bearing through holes, the active contact pads may be connected to traces which are themselves connected to through holes. However, it is preferable to keep all of the through holes and other interconnections between pads and conductive traces within the chip receiving area defined on the printed circuit substrate, as this will typically allow for the flip chip interconnections to use a minimum amount of space on a substrate.

COMPARISON WITH EXISTING TECHNOLOGIES

It is believed that printed circuit assemblies constructed consistent with the principles of the invention offer comparable or increased packaging density over many conventional technologies. For example, typical packaging densities for connecting an unpackaged integrated circuit chip having 196 input/output connections to a substrate are compared in Table I.

TABLE I

| (Surface Area Required for Chip with 196 I/O Connections) | | | |
|---|---|---|---|
| Process | Pad/Side | Pad Pitch (mm) | Surface Area (mm$^2$) |
| C-4 | 49 | 0.2 | 96.04 |
| TAB | 49 | 0.15 | 54.02 |
| Single-Sided Grid Array | 14 | 0.8 | 125.44 |
| Double-Sided Grid Array | 14 | 0.5 | 49.00 |

Using the C-4 process, which includes all the input/output connections along the periphery of a chip, and which has a typical 8 mil (0.2 mm) pitch, 49 input/output connections (196/4) are required on each side of the chip. With 0.2 mm spacing between pad centers (the "pad pitch"), the C-4 process therefore requires a surface area of 9.8 mm ×9.8 mm (0.2 mm×49), or 96.04 mm$^2$ on a substrate.

A tape automated bonding (TAB) process, typically having a 6 mil (0.15 mm) pad pitch, requires a surface area of 7.35 mm×7.35 mm (0.15 mm×49), or 54.02 mm$^2$.

In conventional single layer grid array designs, 196 connections are arranged in a 14×14 grid array of contact pads. Assuming 6 mil (0.15 mm) pads and 2 mil (0.05 mm) conductive traces separated by 2 mil (0.05 mm) line spacing, a 32 mil (0.8 mm) pitch is typically required between contact pads since, at a minimum, 6 traces are required to run between adjacent contact pads. This requires a surface area of 11.2 mm×11.2 mm (0.8 mm×14), or 125.44 mm$^2$.

A double-sided grid array design consistent with the invention offers improved density over the above conventional processes. Using a design rule of a maximum of 3 lines running between adjacent contact pads on the printed circuit substrate, a 0.5 mm pitch between contact pads may be obtained using 0.15 mm pads and 0.05 mm traces separated by 0.05 mm line spacing. The surface area required on a printed circuit substrate using 0.5 mm pad spacing is 7.0 mm×7.0 mm (0.5 mm×14), or 49.00 mm$^2$. This represents approximately 91% of the surface area required for the TAB process, 51% of the surface area required for the C-4 process, and 39% of the surface area required for a single-sided grid array design. It will also be appreciated, however, that significant improvements over other conventional technologies may be obtained without using the minimum possible pitch, for example in lower cost designs which have greater pitches and consequently are less difficult to manufacture.

In addition, when a multilayer embodiment of the invention is utilized, greater reductions in packaging density may be obtained in comparison to conventional processes. Taking, for example, a more complex unpackaged integrated circuit having 676 input/output connections, and using the same dimensions as discussed above, significant advantages may be obtained by using, for instance, a six-layer multilayer construction consistent with the invention. The comparative results are shown in Table II.

TABLE II

| (Surface Area Required for Chip with 676 I/O Connections) | | | |
| --- | --- | --- | --- |
| Process | Pad/Side | Pad Pitch (mm) | Surface Area (mm$^2$) |
| C-4 | 169 | 0.2 | 1142.44 |
| TAB | 169 | 0.15 | 642.62 |
| Single-Sided Grid Array | 26 | 1.4 | 1324.96 |
| Six-Layer ML Grid Array | 26 | 0.5 | 169.00 |

For 676 input/output connections, the C-4 and TAB processes require 169 connections on a side. For C-4, the required surface area is 33.8 mm×33.8 mm (0.2 mm×169), or 1142.44 mm$^2$. Likewise, a TAB process requires 25.35 mm ×25.35 mm (0.15 mm×169), or 642.62 mm$^2$ of surface area. A single-sided grid array design requires, at a minimum, twelve conductive traces to run between adjacent contact pads, which with design rules of 0.15 mm pads and 0.05 mm line width and spacing necessitates a minimum pitch of 1.4 mm. Consequently, the required surface area for a single-sided grid array design is 36.4 mm×36.4 mm (1.4 mm×26), or 1324.96 mm$^2$.

In contrast, using a six-layer multilayer grid array construction with the same design rule of 0.15 mm contact pads and 0.05 line width and spacing, it becomes necessary to route only three traces between adjacent contact pads, permitting pad to pad spacing to be reduced to 0.5 mm. In such a design, 50% of the traces may be routed on the top two layers, with 25% routed to the middle two layers and 25% routed to the bottom two layers. The surface area required is 13.0 mm×13.0 mm (0.5 mm×26), or 169.00 mm$^2$. This represents an area which is 26% of the area required for a TAB process, 15% of the area required for a C-4 process, and 13% of the area required for a single-sided grid array design.

Therefore, it will be appreciated that the present invention provides printed circuit assemblies having greater packaging density in bonding unpackaged integrated circuit chips to a printed circuit substrate. As one skilled in the art will appreciate that various modifications may be made to the preferred embodiments without departing from the spirit and scope of the invention, the invention thus resides in the claims hereafter appended.

I claim:

1. A method for mechanically and electrically interconnecting a flip chip to a printed circuit substrate, the flip chip being of the type including a plurality of bonding pads defined on an active side thereof, at least a portion of the bonding pads having solder bumps formed thereon, and the printed circuit substrate including an adhesiveless metallized laminate having first and second circuit patterns defined on first and second sides of the adhesiveless metallized laminate, respectively, wherein the first side of the adhesiveless metallized laminate includes a plurality of active contact pads defined thereon in a footprint such that each active contact pad is arranged and configured to oppose a corresponding solder bump on the flip chip, and wherein at least one active contact pad includes an electrically conductive through hole for electrically interconnecting the first and second circuit patterns, the method comprising the steps of:

(a) providing solder paste on each active contact pad on the adhesiveless metallized laminate, and including the steps of:
      (1) controlling the volume of the solder paste such that the volume of solder paste located on each active contact pad is optimized as a function of the area of the active contact pad, the connected distance between the adhesiveless metallized laminate and the flip chip, and the volume of the corresponding solder bump; and
      (2) stenciling the solder paste onto the active contact pads through a stencil having etched openings corresponding to each active contact pad;
   (b) placing the flip chip on the adhesiveless metallized laminate such that the solder paste on each active contact pad is in registration with the corresponding solder bump on the flip chip to form an unsoldered chip-substrate assembly; and
   (c) heating the chip-substrate assembly such that the solder paste on each active contact pad reflows to form an electrical connection with the corresponding solder bump on the flip chip.

2. The method of claim 1, wherein the flip chip comprises silicon, and wherein the method further comprises the step of providing the adhesiveless metallized laminate, the providing step including the steps of:

(a) providing a flexible polyimide dielectric film having a coefficient of thermal expansion substantially matched with that of copper;
   (b) forming through holes in the flexible polyimide dielectric film;
   (c) depositing copper on the flexible polyimide film to form first and second copper layers on opposing sides of the flexible polyimide dielectric film and to electrically interconnect the first and second copper layers by metallizing the through holes; and (d) etching the first and second copper layers on the flexible polyimide dielectric film to form the first and second circuit patterns.

3. The method of claim 2, wherein the step of depositing copper forms conductive barrels in the through holes circumscribing apertures formed in the flexible polyimide substrate.

4. The method of claim 3, further comprising the step of depositing a solder mask over the second circuit pattern with the solder mask disposed over the electrically conductive through hole such that, during reflow, a portion of a solder composition formed from the solder bump and the solder paste is trapped within the electrically conductive through hole by the solder mask.

5. The method of claim 3, wherein a portion of a solder composition formed from the solder bump and the solder paste coats the conductive barrel formed in the electrically conductive through hole.

6. The method of claim 2, further comprising the step of depositing a solder mask over the first and second circuit patterns, the solder mask on the first circuit pattern including apertures defined therein to expose the active contact pads on the first circuit pattern.

7. The method of claim 1, wherein the step of heating the chip-substrate assembly comprises heating the chip-substrate assembly as a whole with a heating means which operates by direct infrared radiation of the assembly or by transmission of working fluid, the heating means being from the group including an infrared reflow oven, a vapor phase reflow oven, and a convection reflow oven.

8. The method of claim 7, wherein the heating means is an infrared reflow oven having a nitrogen purge option for inhibiting formation of solder oxides during the heating step.

9. The method of claim 7, wherein the adhesiveless metallized laminate includes a plurality of footprints arranged and configured to receive a plurality of flip chips, each including a plurality of active contact pads arranged and configured on one of the first and second circuit patterns to oppose solder bumps on one of the plurality of flip chips.

10. The method of claim 1, further comprising the step of cleaning the assembly by exposing the assembly to a solvent and ultrasonic energy.

11. The method of claim 10, further comprising the step of coating the assembly with a low stress epoxy encapsulant after heating the chip-substrate assembly.

12. The method of claim 1, wherein a first portion of the bonding pads on the flip chip are disposed about the periphery of the active side of the flip chip, and wherein a second portion of the bonding pads on the flip chip are disposed within an interior portion of the active side of the flip chip.

13. The method of claim 1, wherein the electrical connections formed by the heating step comprise homogeneous solder compositions.

14. The method of claim 1, further comprising the step of securing a third circuit pattern of conductive material to the adhesiveless metallized laminate such that the second circuit pattern is interposed between the first and third circuit patterns, and such that a trace on the third circuit pattern is electrically connected to an electrically conductive through hole which electrically interconnects an active contact pad on the first circuit pattern with the second circuit pattern.

15. The method of claim 14, wherein the third circuit pattern is disposed on a second adhesiveless metallized laminate, and wherein the step of securing the third circuit pattern comprises the step of securing the first and second adhesiveless laminates to one another through a conductive adhesive layer interposed between the second and third circuit patterns such that the second and third circuit patterns are electrically interconnected.

16. A method for mechanically and electrically interconnecting a flip chip to a printed circuit substrate, the flip chip being of the type including a plurality of bonding pads defined on an active side thereof, at least a portion of the bonding pads having solder bumps formed thereon, the method comprising the steps of:

(a) providing the printed circuit substrate as an adhesiveless metallized laminate having first and second circuit patterns defined on first and second sides of the adhesiveless metallized laminate, respectively, wherein the first side of the adhesiveless metallized laminate includes a plurality of active contact pads defined thereon in a footprint such that each active contact pad is arranged and configured to oppose a corresponding solder bump on the flip chip, and wherein at least one active contact pad includes an electrically conductive through hole for electrically interconnecting the first and second circuit patterns, and wherein the providing an adhesiveless metallized laminate step comprises the steps of:

(1) providing a flexible polyimide dielectric film having a coefficient of thermal expansion substantially matched with that of copper;

(2) forming through holes in the flexible polyimide dielectric film;

(3) depositing copper on the flexible polyimide film to form first and second copper layers on opposing sides of the flexible polyimide dielectric film and to electrically interconnect the first and second copper layers by metallizing the through holes; and (4) etching the first and second copper layers on the flexible polyimide dielectric film to form the first and second circuit patterns;

(b) providing solder paste on each active contact pad on the adhesiveless metallized laminate;

(c) placing the flip chip on the adhesiveless metallized laminate such that the solder paste on each active contact pad is in registration with the corresponding solder bump on the flip chip to form an unsoldered chip-substrate assembly; and (d) heating the chip-substrate assembly such that the solder paste on each active contact pad reflows to form an electrical connection with the corresponding solder bump on the flip chip.

17. The method of claim 16, wherein the step of providing solder paste comprises stenciling the solder paste onto the active contact pads through a stencil having etched openings corresponding to each active contact pad.

18. The method of claim 17, wherein the step of providing solder paste includes controlling the volume of the solder paste such that the volume of solder paste located on each active contact pad is optimized as a function of the area of the active contact pad, the connected distance between the adhesiveless metallized laminate and the flip chip, and the volume of the corresponding solder bump.

19. The method of claim 16, further comprising the step of depositing a solder mask over the first and second circuit patterns, the solder mask on the first circuit pattern including apertures defined therein to expose the active contact pads on the first circuit pattern.

20. The method of claim 16, wherein the step of heating the chip-substrate assembly comprises heating the chip-substrate assembly as a whole with a heating means which operates by direct infrared radiation of the assembly or by transmission of working fluid, the heating means being from the group including an infrared reflow oven, a vapor phase reflow oven, and a convection reflow oven.

21. The method of claim 16, further comprising the step of securing the adhesiveless laminate to a second adhesiveless laminate through a conductive adhesive layer, the second adhesiveless laminate including a third circuit pattern electrically interconnected to the second circuit pattern through the conductive adhesive.

22. A method for mechanically and electrically interconnecting a flip chip to a printed circuit substrate, the flip chip being of the type including a plurality of bonding pads defined on an active side thereof, at least a portion of the bonding pads having solder bumps formed thereon, and the printed circuit substrate including an adhesiveless metallized laminate having first and second circuit patterns defined on first and second sides of the adhesiveless metallized laminate, respectively, wherein the first side of the adhesiveless metallized laminate includes a plurality of active contact pads defined thereon in a footprint such that each active contact pad is arranged and configured to oppose a corresponding solder bump on the flip chip, and wherein at least one active contact pad includes an electrically conductive through hole for electrically interconnecting the first and second circuit patterns, the method comprising the steps of:

(a) providing solder paste on each active contact pad on the adhesiveless metallized laminate, including the step of controlling the volume of the solder paste such that the volume of solder paste located on each active contact pad is optimized as a function of the area of the active contact pad, the connected distance between the adhesiveless metallized laminate and the flip chip, and the volume of the corresponding solder bump;

(b) placing the flip chip on the adhesiveless metallized laminate such that the solder paste on each active contact pad is in registration with the corresponding solder bump on the flip chip to form an unsoldered chip-substrate assembly; and (c) heating the chip-substrate assembly such that the solder paste on each active contact pad reflows to form an electrical connection with the corresponding solder bump on the flip chip.

23. The method of claim 22, wherein the flip chip comprises silicon, and wherein the method further comprises the step of providing the adhesiveless metallized laminate, the providing step including the steps of:

(a) providing a flexible polyimide dielectric film having a coefficient of thermal expansion substantially matched with that of copper;

(b) forming through holes in the flexible polyimide dielectric film;

(c) depositing copper on the flexible polyimide film to form first and second copper layers on opposing sides of the flexible polyimide dielectric film and to electrically interconnect the first and second copper layers by metallizing the through holes; and (d) etching the first and second copper layers on the flexible polyimide dielectric film to form the first and second circuit patterns.

24. The method of claim 23, further comprising the step of depositing a solder mask over the first and second circuit patterns, the solder mask on the first circuit pattern including apertures defined therein to expose the active contact pads on the first circuit pattern.

25. The method of claim 22, wherein the step of providing solder paste further comprises stenciling the solder paste onto the active contact pads through a stencil having etched openings corresponding to each active contact pad.

26. The method of claim 22, wherein the step of heating the chip-substrate assembly comprises heating the chip-substrate assembly as a whole with a heating means which operates by direct infrared radiation of the assembly or by transmission of working fluid, the heating means being from the group including an infrared reflow oven, a vapor phase reflow oven, and a convection reflow oven.

27. The method of claim 26, wherein the heating means is an infrared reflow oven having a nitrogen purge option for inhibiting formation of solder oxides during the heating step.

28. The method of claim 26, wherein the adhesiveless metallized laminate includes a plurality of footprints arranged and configured to receive a plurality of flip chips, each including a plurality of active contact pads arranged and configured on one of the first and second circuit patterns to oppose solder bumps on one of the plurality of flip chips.

29. The method of claim 22, further comprising the steps of:

(a) cleaning the assembly by exposing the assembly to a solvent and ultrasonic energy; and (b) coating the assembly with a low stress epoxy encapsulant after heating the chip-substrate assembly.

30. The method of claim 22, wherein the electrical connections formed by the heating step comprise homogeneous solder compositions.

31. The method of claim 22, further comprising the step of securing the adhesiveless laminate to a second adhesiveless laminate through a conductive adhesive layer, the second adhesiveless laminate including a third circuit pattern electrically interconnected to the second circuit pattern through the conductive adhesive.

* * * * *